US006526071B1

(12) United States Patent
Zorabedian et al.

(10) Patent No.: US 6,526,071 B1
(45) Date of Patent: Feb. 25, 2003

(54) TUNABLE LASER TRANSMITTER WITH INTERNAL WAVELENGTH GRID GENERATORS

(75) Inventors: Paul Zorabedian, Mountain View, CA (US); William B. Chapman, Sunnyvale, CA (US); Evan D. H. Green, San Jose, CA (US); Michael Y. Jenq, Saratoga, CA (US)

(73) Assignee: New Focus, Inc., San Jose, CA (US)

( * ) Notice: Subject to any disclaimer, the term of this patent is extended or adjusted under 35 U.S.C. 154(b) by 0 days.

(21) Appl. No.: 09/507,557

(22) Filed: Feb. 18, 2000

Related U.S. Application Data (63) Continuation-in-part of application No. 09/418,950, filed on Oct. 15, 1999, which is a continuation-in-part of application No. 09/342,342, filed on Jun. 29, 1999.
(60) Provisional application No. 60/104,448, filed on Oct. 16, 1998, provisional application No. 60/120,780, filed on Feb. 19, 1999, and provisional application No. 60/152,042, filed on Sep. 2, 1999.

(51) Int. Cl.[7] .................................................. H01S 3/10
(52) U.S. Cl. .............................. 372/20; 372/19; 372/92; 372/98; 372/102; 372/107
(58) Field of Search .............................. 372/20, 19, 92, 372/98, 107, 102

(56) References Cited

U.S. PATENT DOCUMENTS

| | | | | |
|---|---|---|---|---|
| 6,108,355 A | * | 8/2000 | Zorabedian | ................... 372/20 |
| 6,205,159 B1 | * | 3/2001 | Sesko et al. | ................... 372/20 |
| 6,282,215 B1 | * | 8/2001 | Zorabedian et al. | .......... 372/20 |
| 6,324,204 B1 | * | 11/2001 | Deacon | ....................... 372/20 |
| 6,373,672 B1 | * | 4/2002 | Deacon | ....................... 372/20 |

* cited by examiner

Primary Examiner—Leon Scott, Jr.
(74) Attorney, Agent, or Firm—Alan W. Cannon; Bozicevic, Field & Francis LLP (57) ABSTRACT

The present invention provides a continuously tunable external cavity laser (ECL) with a compact form factor and precise tuning to a selected center wavelength of a selected wavelength grid. The ECL may thus be utilized in telecom applications to generate the center wavelengths for any channel on the ITU or other optical grid. The ECL does not require a closed loop feedback. A novel tuning mechanism is disclosed which provides for electrical or mechanical tuning to a known position or electrical parameter, e.g., voltage, current or capacitance, with the required precision in the selected center wavelength arising as a result of a novel arrangement of a grid generator and a channel selector. The grid generator exhibits first pass bands which correspond to the spacing between individual channels of the selected wavelength grid and a finesse which suppresses side band modes of the laser. The channel selector exhibits second pass bands that are wider than the first pass bands. In an embodiment of the invention the second pass bands have a periodicity substantially corresponding with the separation between the shortest wavelength channel and the longest wavelength channel of the selected wavelength grid and a finesse which suppresses channels adjacent to the selected channel. The broad second pass bands of the channel selector reduce the sensitivity of the ECL to tuning variations about the selected channel, thus avoiding the requirement of a closed loop feedback system to control the channel selector.

29 Claims, 8 Drawing Sheets

TUNABLE LASER TRANSMITTER WITH INTERNAL WAVELENGTH GRID GENERATORS

CROSS REFERENCE TO RELATED APPLICATIONS

This application is a continuation-in-part of U.S. application Ser. No. 09/418,950 filed Oct. 15, 1999 entitled "CONTINUOUSLY TUNABLE EXTERNAL CAVITY LASER" by inventors Paul Zorabedian, William B. Chapman, and Michael Y. Jenq, now U.S. Pat. No. 6,282,215; a continuation-in-part of U.S. application Ser. No. 09/342,342 filed Jun. 29, 1999 entitled "CONTINUOUSLY TUNABLE EXTERNAL CAVITY LASER" by inventor Paul Zorabedian, now U.S. Pat. No. 6,108,355; and claims the benefit of prior filed U.S. Provisional Application No. 60/120,780 filed on Feb. 19, 1999 entitled "VOICE-COIL-ACTUATED EXTERNAL-CAVITY DIODE LASER" by inventors Paul Zorabedian, William B. Chapman, and Michael Y. Jenq; and claims the benefit of U.S. Provisional Application No. 60/152,042 filed on Sep. 2, 1999 entitled "TUNABLE LASER TRANSMITTER WITH INTERNAL WAVELENGTH-GRID GENERATOR" by inventors Paul Zorabedian, William B. Chapman, Evan D. H. Green and Michael Y. Jenq.

Each of the above-cited applications is incorporated herein by reference in its entirety.

BACKGROUND OF THE INVENTION

1. Field of Invention

The invention pertains to wavelength-agile laser transmitters for wavelength-division-multiplexed (WDM) optical communications networks. More particularly, the invention pertains to laser transmitters with internal wavelength referencing that can be remotely switched to arbitrarily selectable channels on a standard grid, and to re-configurable optical communications networks.

2. Description of the Related Art

The telecommunications network serving the United States and the rest of the world is presently evolving from analog to digital transmission with ever increasing bandwidth requirements. Fiber optic cable has proved to be a valuable tool, replacing copper cable in nearly every application from large trunks to subscriber distribution plants. Fiber optic cable is capable of carrying much more information than copper with lower attenuation.

The T-1 standards committee ANSI has provided a draft document, "ANSI T1.105-1988", dated Mar. 10, 1988, which sets forth specifications for rate and format of signals which are to be used in optical interfaces. The provided specifications detail the Synchronous Optical Network (SONET) standard. SONET defines a hierarchy of multiplexing levels and standard protocols which allow efficient use of the wide bandwidth of fiber optic cable, while providing a means to merge lower level DS0 and DS1 signals into a common medium. In essence, SONET established a uniform standardization transmission and signaling scheme, which provided a synchronous transmission format that is compatible with all current and anticipated signal hierarchies. Because of the nature of fiber optics, expansion of bandwidth is easily accomplished.

Currently this expansion of bandwidth is being accomplished by what is known as "wavelength division multiplexing" (WDM), in which separate subscriber/data sessions may be handled concurrently on a single optic fiber by means of modulation of each of those subscriber datastreams on different portions of the light spectrum. Therefore, WDM is the optical equivalent of frequency division multiplexing (FDM). Current International Telecommunications Union (ITU) specifications call for channel separations of approximately 0.4 nm, i.e., 50 GigaHertz. At this separation, as many as 128 channels may be carried by a single fiber in a bandwidth range within the same capacity of an erbium doped fiber amplifier (EDFA). Each subscriber datastream is optically modulated onto the output beam of a corresponding semiconductor laser. The modulated information from each of the semiconductor lasers is combined onto a single optic fiber for transmission.

The lasers presently deployed are distributed-feedback (DFB) diode lasers. The wavelength grid is defined by the transmission peaks of a Fabry-Perot reference etalon. The technology for fabricating these etalons from glass or fused silica in large quantities at reasonable cost is well developed. Present transmitters use a combination of a DFB laser and a reference etalon in a feedback control loop. DFB lasers suffer from the drawback that they have small tuning ranges of ~3 nm (See, e.g., J. Carroll, J. Whiteaway, & D. Plumb, *Distributed feedback semiconductor lasers*, SPIE Press, 1998). A DFB laser's characteristics can only be approximately determined by design. In practice the center wavelengths are distributed across the grid span due to statistical variations in the manufacturing process. Thus each DFB laser transmitter must be individually sorted and is usable for only one channel or a small number of adjacent channels. As a result, DFB laser transmitters cannot be assigned to arbitrary channels.

On the other hand, WDM networks are evolving towards re-configurable architectures in which each transmitter's wavelength must be re-selectable by remote command. Re-configurable networks offer significant capacity, reliability, and management advantages over static systems (See, e.g., R. Ramaswami and K. Sivarajan, *Optical Networks, A Practical Perspective*, Morgan Kaufmann Publishers, 1998).

Thus there exists a need for laser transmitters that can be arbitrarily switched to desired channel wavelengths within the wavelength grid of a WDM network.

SUMMARY OF THE INVENTION

The present invention provides a tunable external cavity laser (ECL) with a compact form factor and precise tuning to any selected center wavelength of a predetermined wavelength grid. The ECL may thus be utilized in telecom applications to generate the center wavelengths for any channel on the ITU or other optical grid. The ECL does not require a closed loop feedback. A novel tuning mechanism is disclosed which provides for electrical or mechanical tuning to a known position or electrical parameter, e.g., voltage, current, capacitance, with the required precision in the selected center wavelength arising as a result of a novel arrangement of a grid generator and a channel selector. The grid generator exhibits first pass bands which correspond to the individual channels of a selected wavelength grid and a finesse which suppresses side modes of the laser. The channel selector exhibits second pass bands that are wider than the first pass bands. In an embodiment of the invention the second pass bands have a periodicity that at least substantially corresponds with the separation between the shortest wavelength channel and the longest wavelength channel of the selected wavelength grid and a finesse which suppresses channels adjacent to the selected channel. The broad second pass bands of the channel selector reduce the sensitivity of the ECL to tuning variations of the channel selector about the selected channel, thus avoiding the requirement of a closed loop feedback system of for example wavelength to control the channel selector.

In an embodiment of the invention a tunable external cavity laser tunable to each selected center wavelength of a plurality of channels each centered on a corresponding gridline of a selected wavelength grid is disclosed. The tunable external cavity laser includes a gain medium, a grid generator and a channel selector. The gain medium to emit a beam. The grid generator is located in an optical path of the beam, and the grid generator of a first selected optical path length determinative of a first free spectral range substantially corresponding to a spacing between adjacent gridlines of the selected wavelength grid. The channel selector is located in the optical path of the beam and the channel selector with a second free spectral range broader than the first free spectral range and a selected order of the channel selector tunable within the selected wavelength grid to tune the beam to a selected one of the plurality of channels of the wavelength grid.

In an alternate embodiment of the invention the tunable external cavity laser includes the gain medium, a first filter and a tunable filter. The gain medium to emit a beam. The first filter is located in an optical path of the beam. The first filter exhibits first pass bands substantially corresponding to the channels of the selected wavelength grid. The tunable filter is located in the optical path of the beam. The tunable filter exhibits second pass bands broader than the first pass bands. A selected order of the tunable filter is tunable within the wavelength grid to tune the beam to a selected one of the plurality of channels of the wavelength grid.

In an alternate embodiment of the invention a method for tuning a beam emitted by a gain medium to a corresponding center wavelength for each of a plurality of channels of a selected wavelength grid is disclosed. The method for tuning comprising the acts of:

filtering the beam to provide feedback to the gain medium of a first periodic set of wavelengths substantially corresponding with the center wavelengths for each of the plurality of channels; and tuning the beam to provide feedback to the gain medium of a selected one of the center wavelengths of the first periodic set of wavelengths to tune the beam to the selected one of the plurality of channels.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION OF THE EMBODIMENTS

The present invention provides a tunable external cavity laser (ECL) with a compact form factor and precise tuning to any selected center wavelength of a selected wavelength grid. The ECL may thus be utilized in telecom applications to generate the center wavelength for any channel on the ITU or other optical grid. The ECL does not require a closed loop feedback. A novel tuning mechanism is disclosed which provides for electrical or mechanical tuning to a known position or electrical parameter, e.g., voltage, current, capacitance, with the required precision in the selected center wavelength arising as a result of a novel arrangement of a grid generator and a channel selector. The grid generator exhibits first pass bands which correspond to the individual channels of the selected wavelength grid and a finesse which suppresses side modes of the laser. The channel selector exhibits second pass bands that are wider than the first pass bands. In an embodiment of the invention the second pass bands have a periodicity that at least substantially corresponds with the separation between the shortest wavelength channel and the longest wavelength channel of the selected wavelength grid and a finesse which suppresses channels adjacent to the selected channel. The tuning mechanism does not require a closed loop feedback system, of for example wavelength, to control the channel selector.

Figure 1:
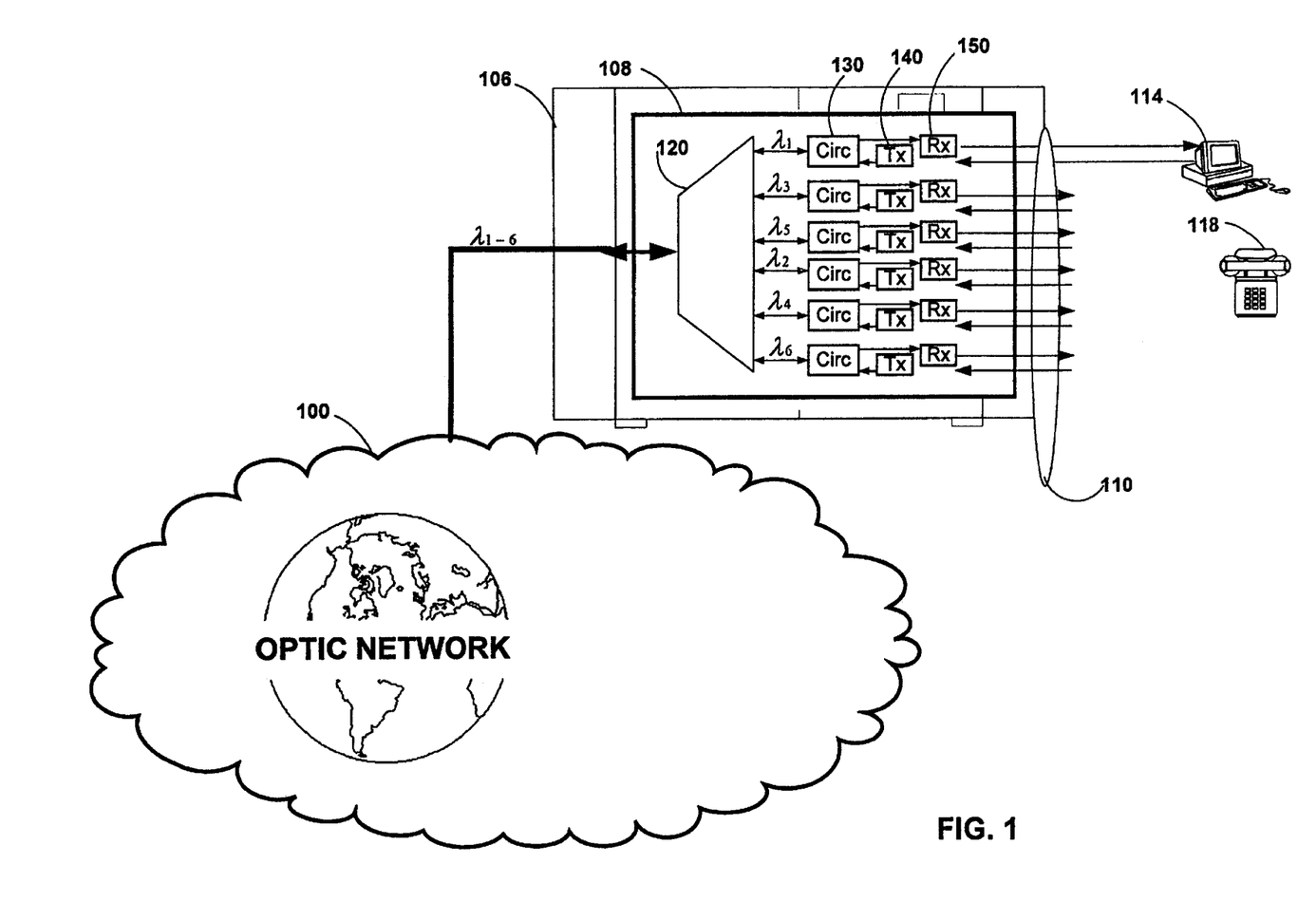
FIG. 1 shows an embodiment of the invention in which an optical network is coupled to a plurality of data and voice subscriber lines by an optical mux/demux utilizing external cavity lasers tunable to the center frequency of any of the wavelength division multiplexed channels on the optical network.

FIG. 1 shows an embodiment of the invention in which an optical network is coupled to a plurality of data and voice subscriber lines by an optical mux/demux utilizing ECL's tunable to the center frequency of any of the WDM channels on the optical network. An optical network 100, a central office or remote terminal 106, a data terminal 114 and voice terminal 118 are shown. The modulated data may be carried on a number of channels in multiple access protocols including but not limited to: wavelength division multiplexing (WDM), dense wavelength division multiplexing (DWDM), frequency division multiple access (FDMA), etc. Currently this expansion of bandwidth is being accomplished by what is known as "wavelength division multiplexing" (WDM), in which separate subscriber/data sessions may be handled concurrently on a single optic fiber by means of modulation of each of those subscriber datastreams on different portions of the light spectrum. The precise center frequencies of each channel are specified by standard setting organizations such as the International Telecommunications Union (ITU). These center frequencies are set forth as part of a wavelength grid which defines the center frequencies and spacing between channels.

At each node in the network, e.g., central office or remote terminal 106, optical transceivers mounted on fiber line cards, e.g., card 108, are provided. Each line card includes a multi-stage multiplexer/de-multiplexer 120, a circulator bank 130, a transmitter bank 140, and a receiver bank 150. The multiplexer/de-multiplexer is a passive optical device which divides wavelengths (or channels) from a multi-channel optical signal, or combines various wavelengths (or channels) on respective optical paths into one multi-channel optical signal depending on the propagation direction of the light.

In the receive mode, after de-multiplexing, each individual channel is passed via a corresponding circulator within circulator bank 130 to a corresponding receiver in receiver bank 150. Each receiver includes a narrow bandpass photodetector, framer and decoders. Switches (not shown) couple the receiver over the corresponding subscriber line 110 to a voice or data terminal 118, 114, respectively.

In the transmit mode, each line card transmitter bank 140 includes a bank of lasers, for example one-hundred and twenty eight lasers, radiating light at one of the selected center frequencies of each channel of the telecommunications grid. The wavelength range of current optical grids is 1525–1575 nm. Each subscriber datastream is optically modulated onto the output beam of a corresponding semiconductor laser. A framer permits framing, pointer generation and scrambling for transmission of data from the bank of lasers and associated drivers. The modulated information from each of the semiconductor lasers is passed via a corresponding circulator into the multiplexer 120, the output of which couples with a single optic fiber for transmission. The operation of the line card in the embodiment shown is duplex, meaning that bi-directional communications are possible. Thus, the same device operates as a multiplexer and de-multiplexer.

Figure 2A:
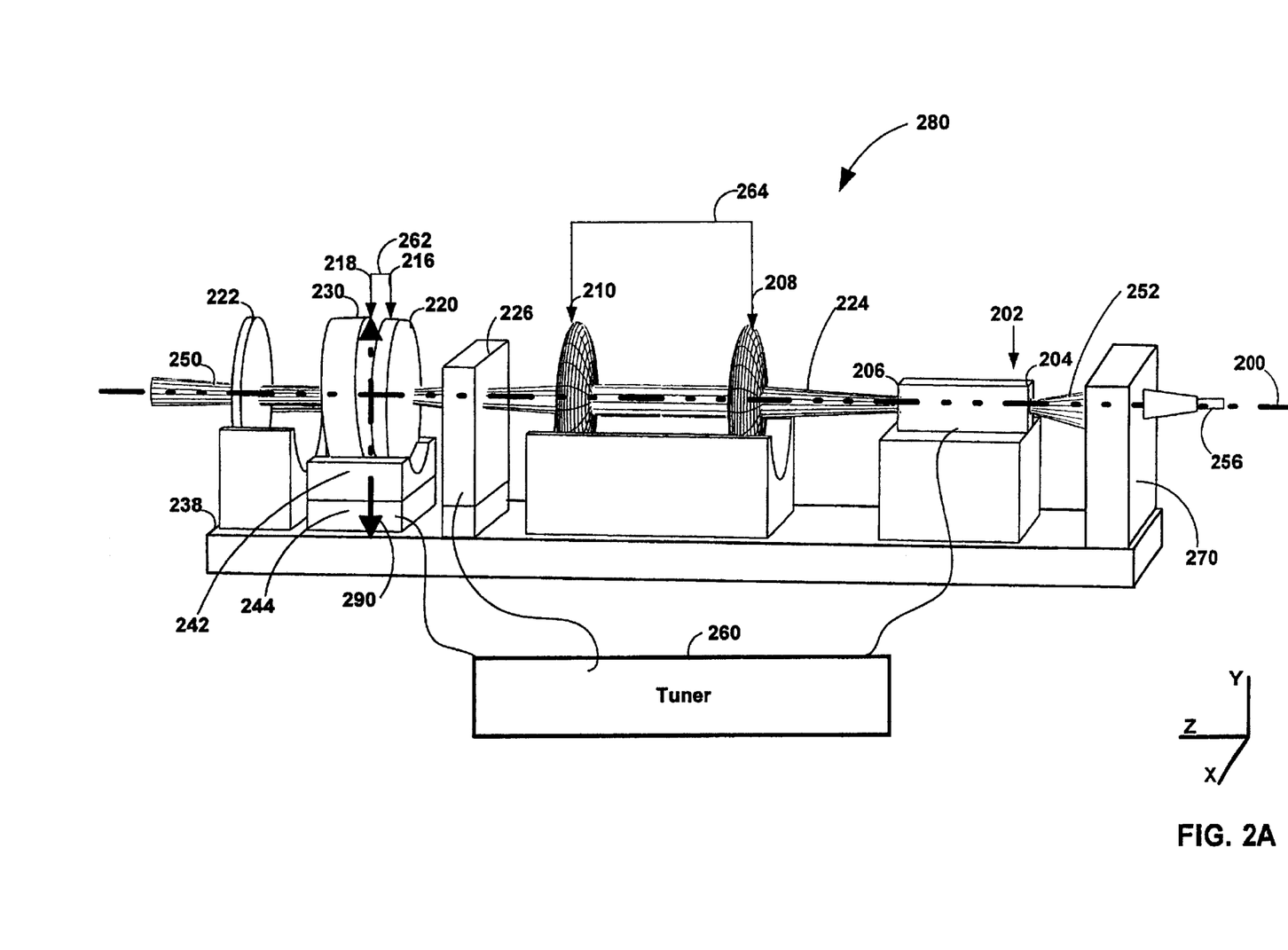
FIG. 2A is an isometric side view of a tunable external cavity laser according to the current invention.
Figure 2B:
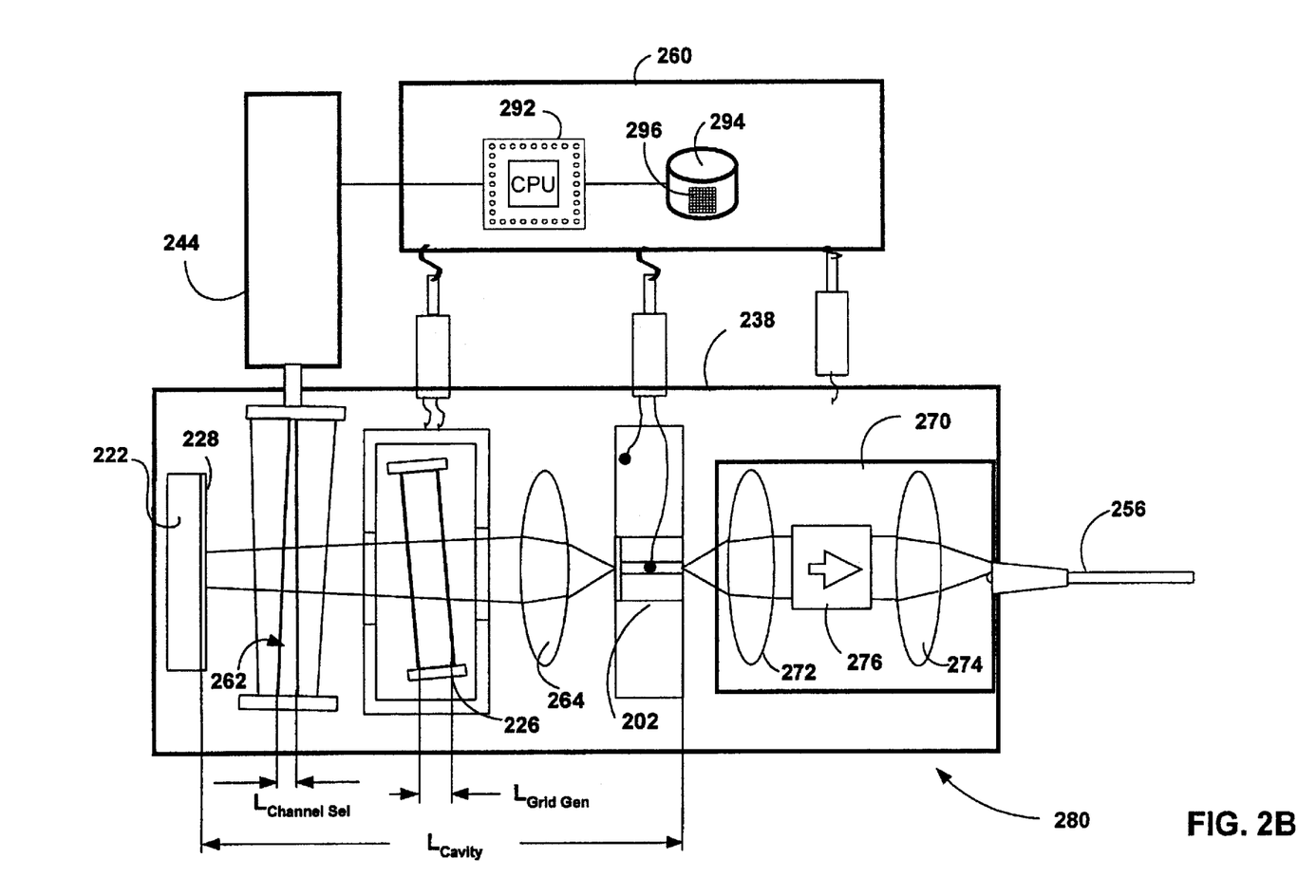
FIG. 2B is an isometric top view of a tunable external cavity laser according to the current invention.

FIGS. 2A–B are isometric side and top views, respectively, of a tunable external cavity laser according to the current invention. The laser cavity is delimited by the partially reflecting rear facet 204 of the gain medium/laser amplifier 202 and by an external retroreflector 222. Tunable feedback to control the lasing wavelength is provided by the external cavity which is optically coupled to the anti-reflection (AR) side 206 of the gain medium. The effective reflectivity of the external cavity should be much greater than the residual reflectivity of the AR coated front facet so that the grid generator 226 and the channel selector, e.g., interference filter/etalon 262, can deliver sufficient feedback to put the laser in the "strong feedback" regime. The external cavity laser also includes lens system 264, actuator 244, tuner 260, base 238, output coupling optics 270, and fiber optic 256. The laser amplifier 202 in the embodiment shown is a laser diode. The lens system 264 includes collimating or focusing lenses 208–210. The etalon includes first and second reflectors, 216–218 deposited on transparent substrates 220, 230 respectively.

Structurally, the tunable laser is shown laid out along an optical path 200. Coupling optics 270 are positioned between the back facet 204 of the laser 202 and a fiber optic 256. The laser amplifier, in an embodiment of the invention, is a conventional Fabry-Perot laser diode. The front and rear facets 206–204 of the laser diode are aligned with the longitudinal axis 200. The front facet has an AR coating with a reflectivity of less than 0.5%. The rear facet in this embodiment includes a partially reflecting dielectric coating. The proximal end of the external cavity is located at the front facet 206 of the laser diode. The distal end of the external cavity is defined by the retroreflector 222. The cavity itself extends from the rear facet of the gain medium to the retroreflector.

Within the cavity, a channel selector 262, grid generator 226, and collimating or focusing lens pair 208–210 is mounted coaxially with the optical path 200. The collimating or focusing lens pair is mounted proximate the front facet 206 of the gain medium 202. These lenses collimate and focus rays from the laser diode 202 onto the grid generator 226. The rays are focused so that the waist portion of the beam, i.e., the portion in which wave fronts are substantially planar, intersects the grid generator 226 and the air gap portion of the channel selector 262. In an alternate embodiment of the invention a single lens could be utilized to accomplish both collimation and/or focusing.

The grid generator operates as a filter, e.g., an interference filter with a thickness Lg and index of refraction $n_g$ chosen such that its loss spectrum comprises a multiplicity of minima within the communications band at wavelengths that coincide with the center wavelengths of the selected wavelength grid. More generally the grid generator filter function results in a plurality of passbands centered on each of the gridlines of the selected wavelength grid. (See FIGS. 6A–F). The grid generator has a finesse that suppresses neighboring modes of the laser between each channel. In this embodiment of the invention the grid generator is an interference element, e.g., a parallel plate solid, liquid or gas spaced etalon. In an alternate embodiment of the invention the grid generator may be tuned by precise dimensioning its thickness. Alternately, the optical thickness of the grid generator may be varied by tilting or by precise temperature control. In another embodiment of the invention the grid generator is electro-optically active and is tuned by means of an applied electric field. The grid generator is dimensioned to have a free spectral range ($FSR_{Grid\_Gen}$) corresponding to the spacing between gridlines of a selected wavelength grid, e.g., an ITU grid (See FIGS. 6A–F). In this embodiment of the invention the grid generator is fixed to the base 238.

The channel selector 262 also operates as a filter, e.g., a Fabry-Perot filter an interference filter, etc., with constructive interference, that results in a plurality of passbands broader than those generated by the grid generator. In a preferred embodiment of the invention the plurality of passbands at least substantially corresponds to the separation between the longest wavelength channel and the shortest wavelength channel. In the preferred embodiment of the invention the second pass bands have a periodicity greater than or substantially equal to the separation between the shortest wavelength channel and the longest wavelength channel of the selected wavelength grid and a finesse which suppresses channels adjacent to the selected channel. In an alternate embodiment of the invention the second pass bands have a periodicity corresponding with the gain bandwidth of the gain medium, e.g. a laser diode.

In this embodiment the channel selector includes a gas etalon 262. The gas etalon includes opposing planar first and second reflectors 216–218 defining between them a wedge-shaped air gap. The reflectors may be formed by dielectrically coating the interior faces of the transmissive substrates 220,230 with a highly reflecting, e.g., R>90% dielectric layer. The channel selector is dimensioned to have a free spectral range ($FSR_{Channel\_Selector}$) broader than that of the grid generator ($FSR_{Grid\_Gen}$) which is itself broader than the free spectral range of the cavity ($FSR_{Cavity}$).

The free spectral range, FSR, of an optical element varies inversely with the index of refraction "n" of the element and the physical length "L" of the element, i.e.

$$FSR = \frac{c}{(2nL)}$$

where c is the speed of light in a vacuum. Optical elements including diffraction gratings may be defined in terms of their FSR. In FIG. 2B the physical lengths are shown for the grid generator, channel selector and cavity are shown. In the embodiment shown the channel selector is a wedge shaped etalon the length of which varies as the actuator moves it across the optical path. (See FIG. 2B and FIGS. 6A–F). In an embodiment of the invention, the FSR of the channel selector corresponds with the full wavelength range of the selected wavelength grid, e.g., an ITU grid (See FIGS. 6A–F). This results in a single loss-minimum within the communications band which can be tuned across the grid. The channel selector in this embodiment of the invention is movably coupled to the base 238 via a mounting block 242 and actuator 244. The combined feedback to the gain medium from the grid generator together with the channel selector supports lasing at the center wavelength of the selected channel and substantially attenuates all other channels (See FIGS. 6A–F).

Channel selection is brought about by changes in the optical path length of the channel selector. This in turn may result from either or both a change in the index of refraction of the channel selector 262 of its thickness along the optical path. In the embodiment shown the changes result from the variations in the thickness of the channel selector along the optical path of beam 224. These in turn result from its wedge shape and the movement of that shape along path 290 across the optical path in response to actuator 244. In the retracted position 204, the beam traverses relatively thicker portions of the air gap etalon. In the extended position 206, the beam traverses a relatively thinner portion of the air gap etalon. Thus, in the extended position of the etalon and corrective element, the etalon supports shorter wavelength channels at which constructive interference takes place between the reflective surfaces of the etalon. In the retracted position, the etalon supports longer wavelength channels. The required range of motion of the actuator 244 along path 290 may be in the centimeter range in practice. The FSR of the channel selector varies during tuning, but the variation is slight, e.g., less than +/−1%. The tuning range of the channel selector is limited to a range around a selected order which falls within the wavelength grid. Across the tuning range, the FSR of the channel selector is broader than that of the grid selector.

In this embodiment of the invention a mechanical actuator 244 is utilized to position the channel selector and to select a center frequency for the output beam corresponding with one of the selected channels on the wavelength grid. The tuner 260 provides the electrical impulse to control the expansion and contraction of the actuator along the path 290. Suitable actuators may deliver linear or arcuate displacement and include but are not limited to: stepper motors, DC servomotors, solenoids, voice-coils. ultrasonic motors, shape-memory actuators, piezo electrics, etc.

The channel selector may be implemented with other optical elements including: diffraction elements, interference elements other than air gap etalons, and birefringent elements. The channel selector may be implemented as a wedge shaped solid or air gap etalon with an arcuate actuator (Not shown). The channel selector may be implemented with a parallel plate etalon with a rotary actuator to vary the angle at which it intersects the optical path (See FIG. 3). The channel selector may be implemented as an air gap etalon with a mechanically, thermally, electrically, or magnetically actuated gas-filled gap to vary either or both the refractive index or thickness of the gap (Not shown). The channel selector may be implemented as a Fabry-Perot etalon with an electro-optically tunable spacer medium, such as a liquid crystal. The channel selector may be implemented with a diffraction element and a rotary actuator to vary the angle at which the grating intersects the optical path (See FIG. 4). The FSR of the diffraction element, e.g. grating, is selected in the same manner as discussed above for the wedge shaped etalon. The channel selector may be implemented with a birefringent material, gas, liquid or crystal which provides a variable optical pathlength in response to a stimulus, electrical or mechanical. Examples of birefringents with electro-optic properties include Pockels and Kerr cells (Not shown).

The tunable laser is controlled by a tuner 260 which couples to the actuator 244 and may additionally couple to the laser 202, to the grid generator 226. Additional connections between the tuner and environmental control elements within the device may be provided. These may be utilized to regulate the operating temperature of the device. The temperature control of the device may include individual temperature control of: the grid generator, the base 238, and the gain medium 202. Within the tuner 260, a processor 292 and memory 294 are shown. The memory includes both program code as well as a lookup table 296. The lookup table may contain data or formula which correlate wavelength with position. In the embodiment shown, the lookup table may contain a formula or a plurality of records which correlate the center frequency of each channel with a specific tuning parameter of the mechanical, electrical or opto-electrical tuning device. Mechanical parameters include positions of the channel selector. Electrical parameters include current, voltage, capacitance, and inductance. Opto-electric parameters include birefringence. The parameters may be input for a group of similar devices or may be individually calibrated for each device, using a wavelength meter during assembly of the device.

To calibrate an individual device the ECDL, the processor 292 sweeps the channel selector through the entire tuning range pausing at increments along the tuning range to allow the wavelength meter to correlate the measured wavelength with the center wavelengths of each channel. As each center wavelength is detected or interpolated, the tuning parameter corresponding with that parameter is measured as well. These correlations are then written to the memory 294 as individual records or as a formula from which individual records may be calibrated. With the wavelength information thus embedded in the assembled lasers on-board memory, the tunable laser is shipped with only the tuner 260 and without the wavelength meter. The absence of a closed loop feedback for tuning results in a reduced form factor cost and complexity in the subject instrument.

The precision of the device and the absence of the requirement of a closed loop feedback to accurately tune the device result from the fact that the slope of the output with respect to the control parameter, e.g., electrical or mechanical, is substantially zero over a range Δx around each channel position and makes sharp transitions near the midpoints between adjacent channels (See FIGS. 6A–F). This feature relaxes the precision to which the control variable must be set to select any given channel and enables a simple, open loop, "single-knob" control the transmitter.

In an alternate embodiment of the invention the device may be fine tuned by logic which controls the temperature of any one or all of: the gain medium, the base, and the grid generator to maintain the accuracy of the selected center frequencies with those of the selected wavelength grid. The device may be fine-tuned by logic which senses the output of the laser and compares the output with a master reference etalon. This process generates a fine-tuning signal to the transmitter's internal temperature controller for the purpose of aligning the internal reference to the master. This process need not be conducted continuously but can be applied intermittently to correct for long term drifts due to thermistor aging or other factors.

In FIG. 2A the output beam 250 is shown passing through the partially back facet of the retroreflector 222 while output beam 252 is shown passing through the partially reflective back facet 204 of the laser diode 202. In a typical device only one output beam, either 250 or 252 would be available, with the other blocked by a highly reflective coating on the corresponding one of the retroreflector or the back facet of the laser diode. The coupling of an output beam, either 250 or 252 to an optic fiber is provided by an optical coupler. In FIG. 2B, an optical coupler 270 with lenses 272–274 and a feedback blocker 276, e.g. a non-reciprocal element, is shown coupling fiber optic 256 to output beam 252. In this embodiment the retroreflector is fully reflective and the back facet 204 of the diode 202 is partially reflective, thus providing an output beam from the back facet. Tapping the output beam from the retroreflector back facet has the added benefit of providing lower source spontaneous emission since the output beam makes a complete pass through all optics in the system.

In alternate embodiments of the invention tilting of either or both the grid generator and the channel selector may be implemented to reduce spurious feedback to the gain medium. In still other embodiments of the invention a one way filter system may be added to the cavity to further reduce spurious feedback to the gain medium. Such a system may employ quarter wave plates positioned between lenses 208–210 and between the channel selector 262 and the retroreflector 222. Since the output beam of the laser is polarized, the quarter wave plates block the return of light to the gain medium that has not made a dual pass through both the grid generator and channel selector. In either embodiment the close proximity of cavity lens, gain medium, output lens, isolator, fiber-launch lens, and fiber provides for integration of these components into a highly-stable optomechanical subsystem that can be hermetically sealed and plugged into the external cavity, thus enhancing tolerance to ambient temperature, shock, and vibration.

Figure 3:
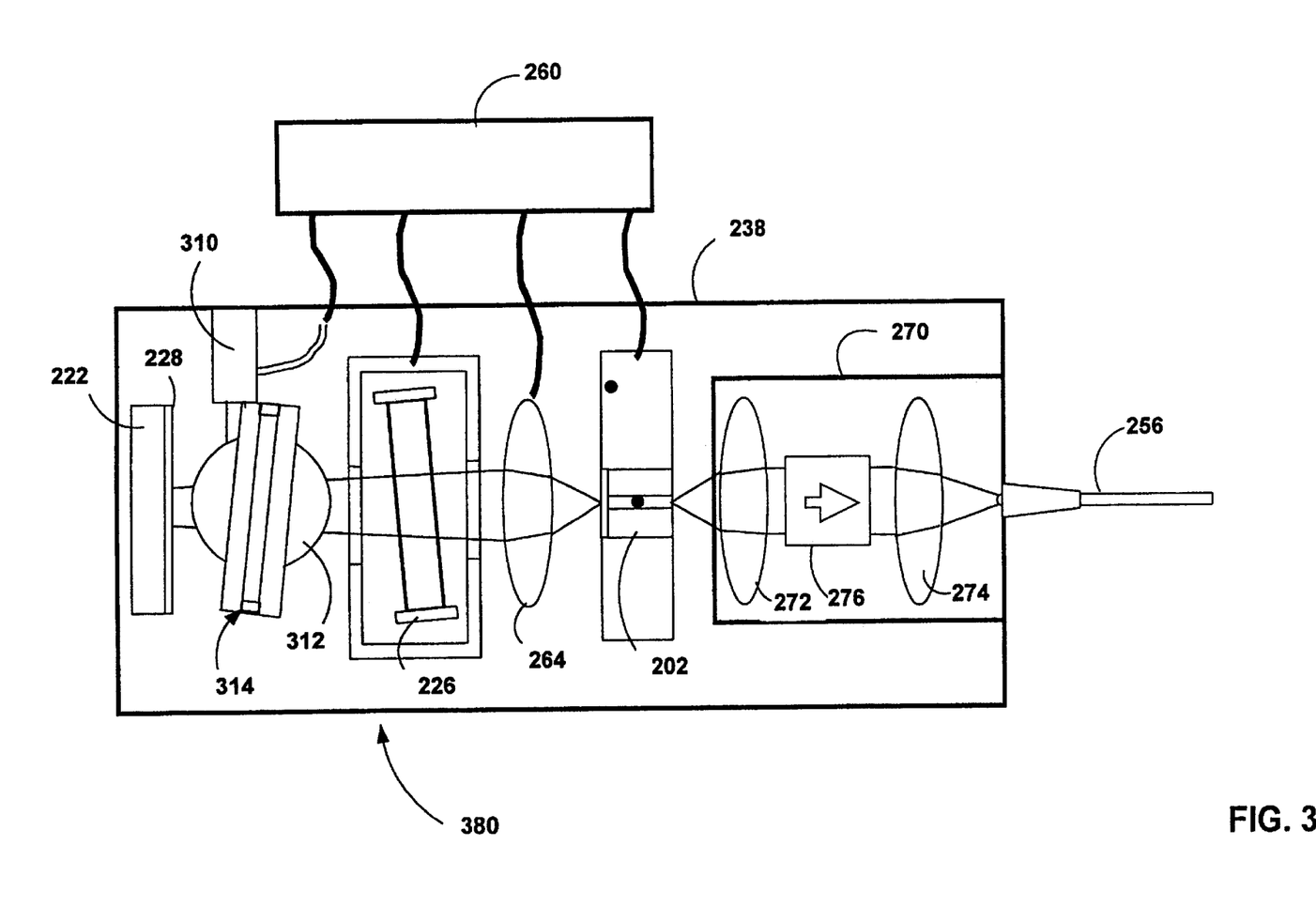
FIGS. 3–4 are top views of alternate embodiments of the external cavity laser shown in FIG. 2.

In FIG. 3 an alternate embodiment of the external cavity laser 380 is shown. Tuning is provided by rotation of the channel selector 314 brought about by actuator 310 and rotary mount 312 to which the channel selector is coupled. The channel selector in this embodiment is a parallel plate etalon 314 with an $FSR_{Channel\_Selector}$ broader than that of the grid generator ($FSR_{Grid\_Gen}$), which is itself broader than the free spectral range of the cavity ($FSR_{Cavity}$) (See FIG. 2B and FIGS. 6A–F). In an embodiment of the invention the FSR of the channel selector corresponds with the full wavelength range of the selected wavelength grid, e.g., an ITU grid (See FIGS. 6A–F).

Figure 4:
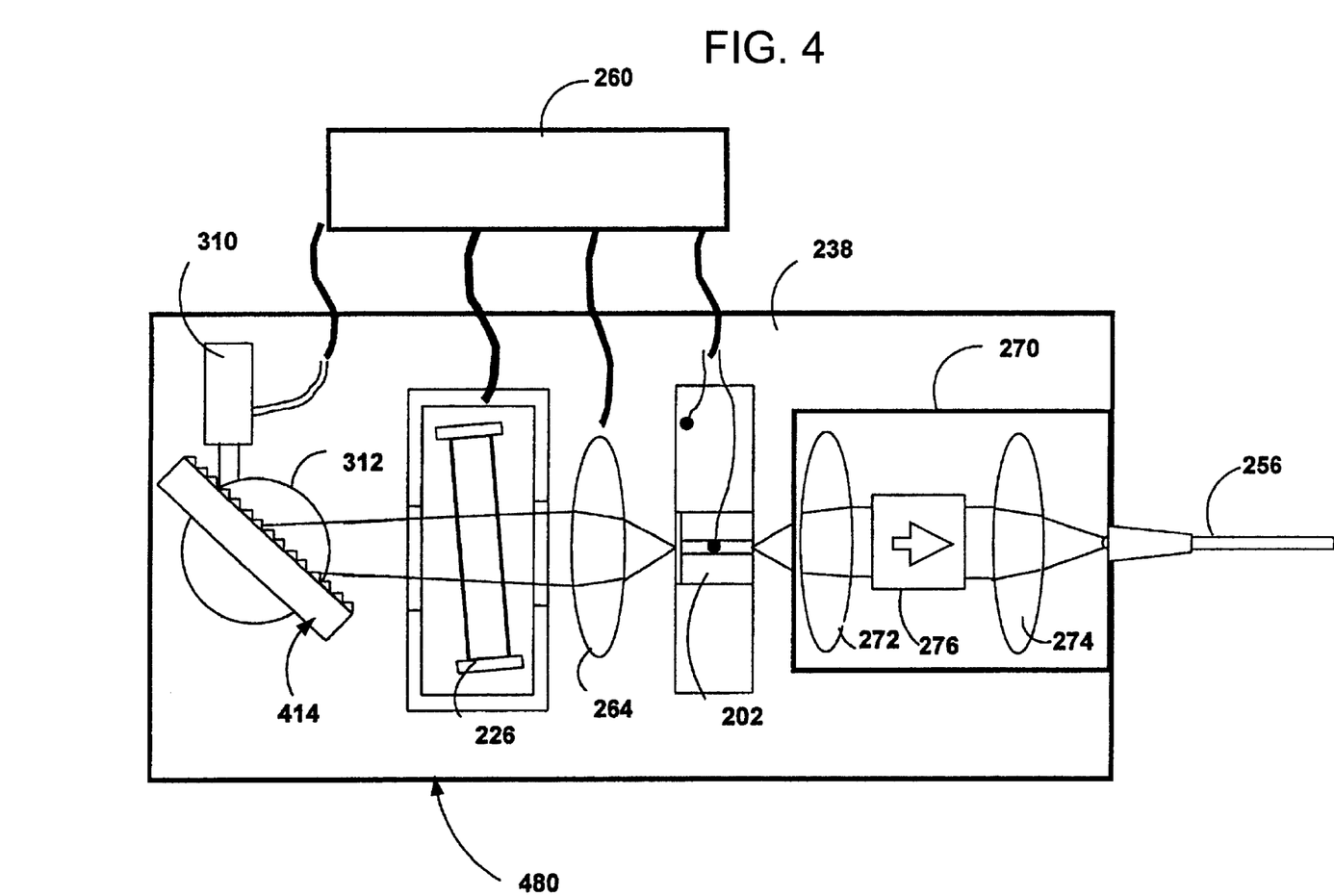

In FIG. 4, another embodiment of the external cavity tunable laser 480 is shown. The configuration of the components is the same as in the first preferred embodiment with the exception of the channel selector 414 which includes a diffraction grating. The diffraction grating is tuned by actuator 310 and rotary mount 312 to which the diffraction grating is coupled. Tuning is accomplished by varying the angle of incidence on the surface of the grating. The FSR of the grating is broader than that of the grid generator ($FSR_{Grid\_Gen}$), which is itself broader than the free spectral range of the cavity ($FSR_{Cavity}$) (See FIG. 2B and FIGS. 6A–F). In an embodiment of the invention the FSR of the grating corresponds with the full wavelength range of the selected wavelength grid, e.g., an ITU grid (See FIGS. 6A–F).

Figure 5:
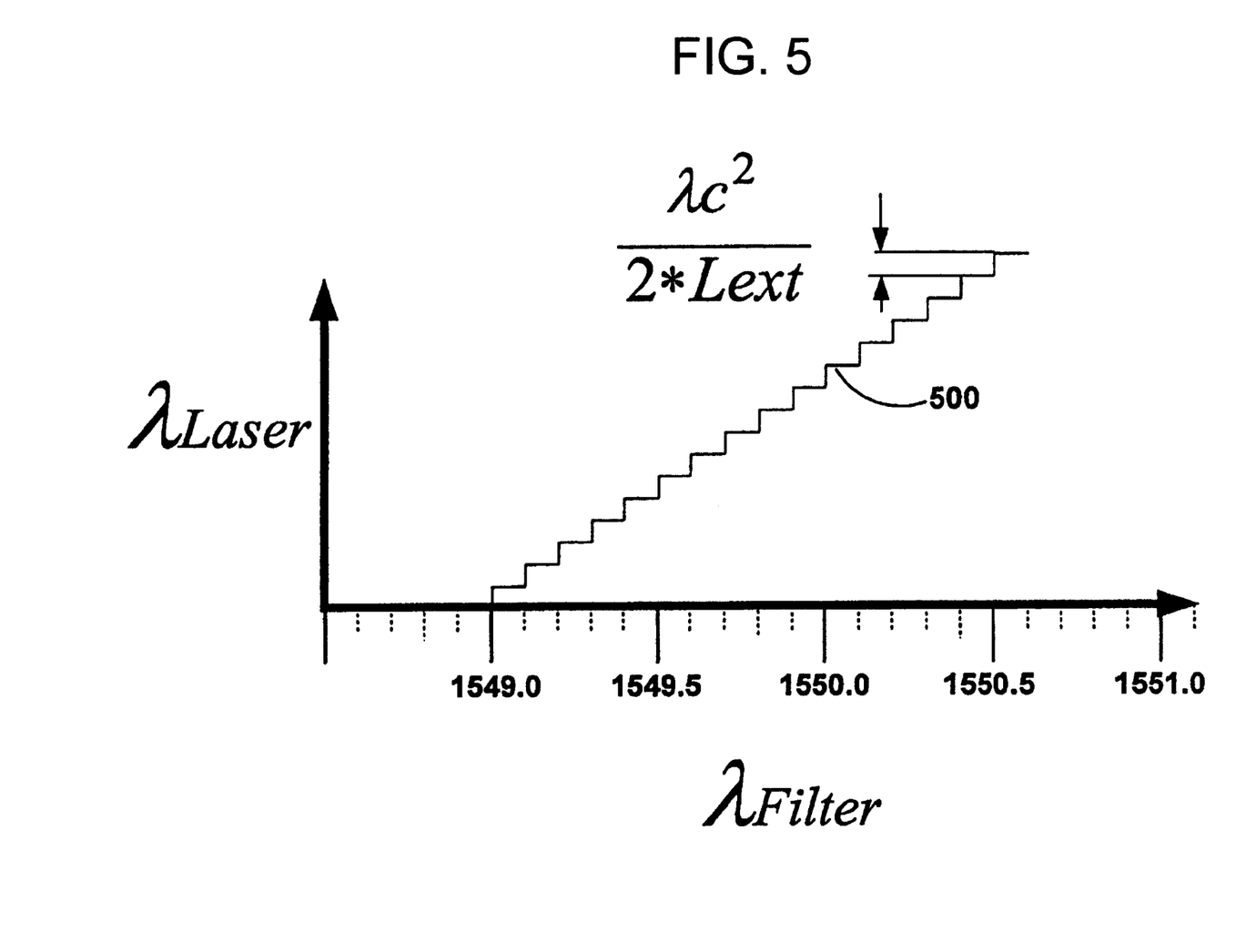
FIG. 5 is a graph which shows the mode hopping of the external cavity laser shown in the accompanying FIGS.

FIG. 5 is a graph which shows the tuning characteristic of the external cavity tunable laser discussed above. External cavity lasers for test and measurement applications typically are designed to have a loss minimum that varies continuously with respect to the tuning control variable, resulting in a linear tuning characteristic that provides complete, continuous wavelength coverage over a specified range. In contrast, the laser of the present invention is designed to have a distinctly discontinuous, discrete, staircase-tuning characteristic.

The graph shows lasing wavelength versus the selected center wavelengths of the wavelength grid. In an embodiment of the invention, the optical pathlength of the cavity, including optical elements as well as the air or gas which fills the void between elements, is designed so that selected modes of the cavity align with the center frequency of the channels of the wavelength grid. The characteristic has a staircase shape which is highly desirable. Due to this shape, the position tolerance of the channel selector is greatly relaxed, so that the selector can be controlled in an open-loop manner using a lookup table. This provides the obvious benefit of making closed-loop feedback control unnecessary. The wavelengths of the longitudinal modes of the laser cavity are related to the cavity length by $$L_{ext} \approx m \cdot \frac{\lambda_m}{2}$$

where m is an integer referred to as the mode number. Typically $m > 10^3$. The laser may only oscillate at wavelengths which are longitudinal modes. The size of the mode-hops is approximately $$\frac{\lambda_c^2}{2L_{ext}}$$

where $\lambda$ is the center of the tuning range. Therefore, if the cavity length remains constant as the filter/etalon peak is tuned, the laser output will change discontinuously, giving rise to a tuning characteristic known as mode-hop tuning (See FIG. 3A).

Figure 6A:
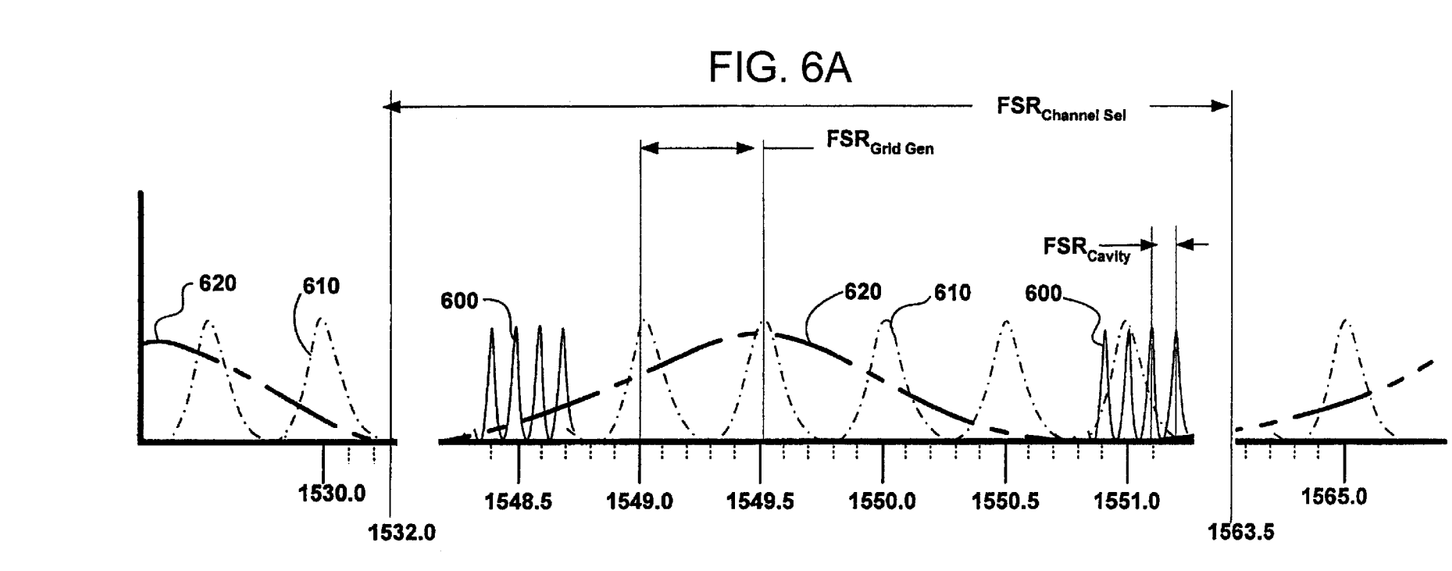
FIGS. 6A–C are graphs showing pass bands for the laser cavity, the grid generator, and the channel selector with respect to a selected channel grid.
Figure 6B:
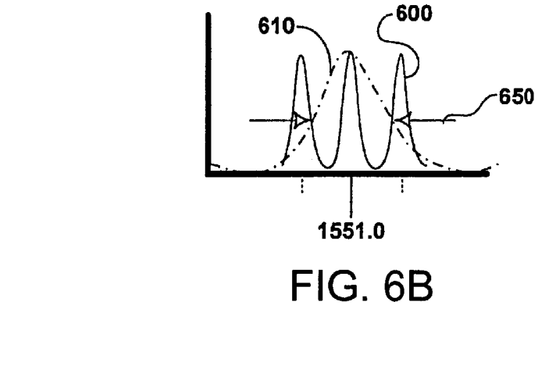
Figure 6C:
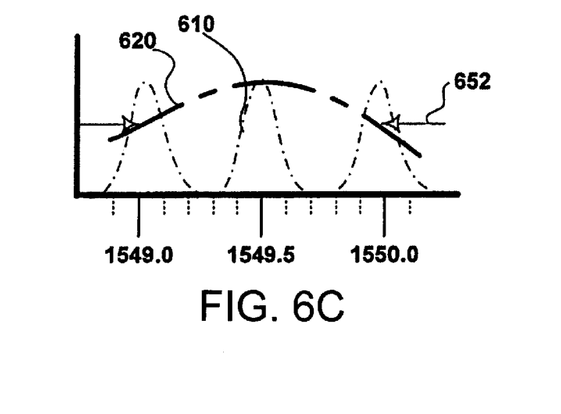
Figure 6D:
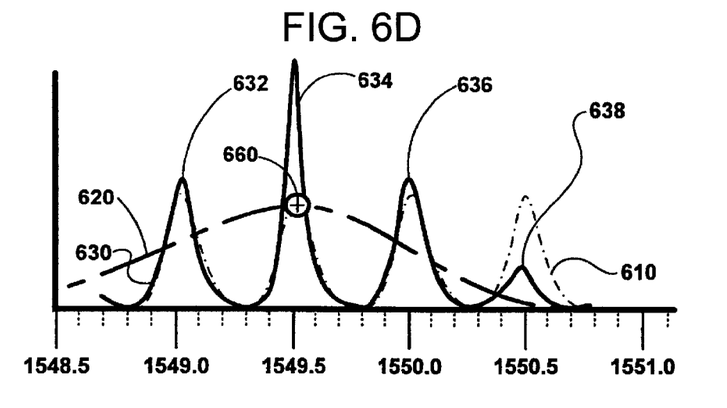
FIGS. 6D–F are graphs showing the gain for each of a plurality of channels on a WDM grid responsive to tuning of the external cavity laser.
Figure 6E:
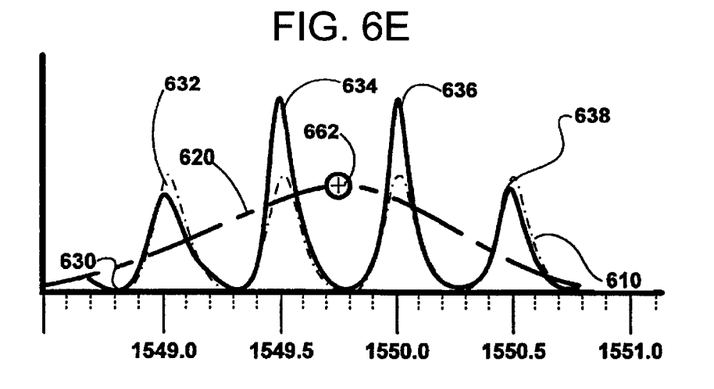
Figure 6F:
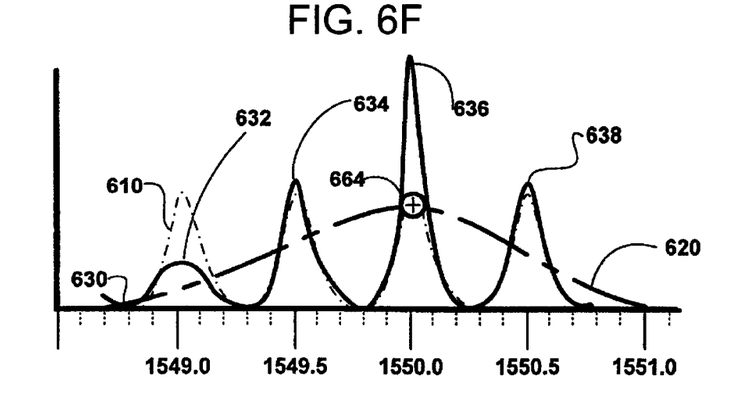

FIGS. 6A–C are graphs of the individual filter characteristics, i.e., pass bands for the laser cavity, the grid generator, and the channel selector with respect to a selected channel grid. Gain is shown on the y-axis and wavelength on the x-axis. FIGS. 6D–F are graphs showing the combined filter characteristics for the grid generator and channel selector with respect to a selected WDM grid and responsive to tuning of the ECDL. In FIGS. 6A–C the cavity pass bands 600, the grid generator pass bands 610, and the channel selector pass bands 620 are shown. Each has specific periodic relationships to the other. The periodic peaks, i.e. pass bands 600 of the cavity, periodically align with the center wavelengths of each of the channels in the wavelength grid. In the example shown, that grid extends over 64 channels periodically spaced apart at 0.5 nm or 62 GHz intervals, between the shortest wavelength channel 1532 nm to the longest wavelength channel 1563.5 nm. The periodic peaks, i.e. pass bands 610 of the grid generator, periodically align with each center wavelength of each channel in the selected wavelength grid. There is one periodic peak of the channel selector, i.e. pass bands 620 within the bandwidth of the wavelength grid.

These relationships are expressed in the following Equation 1A–B.

$$FSR_{GridGen} \approx i \cdot FSR_{Cavity} \qquad \text{Equation IA}$$

$$FSR_{ChanSel} \geq \approx M \cdot FSR_{GridGen} \qquad \text{Equation IB}$$

where i is an integer indicating the number of laser modes between gridlines and M is the total number of channels within the selected wavelength grid.

Equation II expresses the FSR of the grid generator as a function of the optical pathlength of the grid generator and the spacing between channels in the wavelength grid:

$$FSR_{GridGen} = \left(\frac{1}{2}\right)\frac{c}{n_g \cdot L_g} \approx \text{Channel\_Spacing} \qquad \text{Equation II}$$

where c is the speed of light in a vacuum, $n_g$ is the refractive index of the grid generator and $L_g$ is the length along the optical path of the grid generator. For the grid generator assuming an index of refraction of 1.0 and a channel spacing of 0.5 nm or approximately 62 GHz the thickness would be approximately equal to 2 mm.

Equation III expresses the FSR of the channel selector as a function of the optical pathlength of the channel selector and the bandwidth of the wavelength grid:

$$FSR_{ChanSel} = \left(\frac{1}{2}\right)\frac{c}{n_s \cdot L_s} \geq \approx M \cdot FSR_{GridGen} \qquad \text{Equation III}$$

where $n_s$ is the refractive index of the channel selector and $L_s$ is the length along the optical path of the channel selector. For the channel selector assuming an index of refraction of 1.0 and a channel spacing of 0.5 nm or approximately 62 GHz the thickness would be greater than or approximately equal to 2 μm.

The broad second pass bands of the channel selector reduce the sensitivity of the ECL to tuning variations of the channel selector about the selected channel. Whether tuning of the channel selector is accomplished mechanically, electrically, etc., the required precision of the tuning is reduced as a result of the broad second pass bands of the channel selector. This allows the channel selector to be operated with an open loop system.

Equation IV expresses the FSR of the overall cavity as a function of channel spacing:

$$FSR_{Cavity} = \left(\frac{1}{2}\right)\frac{c}{\sum n_i \cdot L_i} \approx \frac{\text{Channel\_Spacing}}{i} \qquad \text{Equation IV}$$

where i is an integer series corresponding to each element, lens, gain medium, etalons, gratings, etc. and including air/gas within the combined internal and external cavities and $n_i$ is the refractive index of the $i_{th}$ element in the cavities and $L_i$ is the length along the optical path of the $i_{th}$ element in the cavity. For the cavity assuming an index of refraction of 1.0 and mode spacing of ⅕ the channel spacing or 0.1 nm or approximately 12.4 GHz the length would be approximately 10 mm.

When the grid generator and channel selector are optically coupled in an optical cavity of an ECDL to provide feedback to the gain medium, the following relationship is attained. The grid generator selects periodic longitudinal modes of the cavity at intervals corresponding to the channel spacing and rejects neighboring modes. The channel selector selects a channel within the wavelength grid and rejects other channels.

The finesse of each filter determines the attenuation of its nearest neighboring modes or channels. Finesse is the ratio of the separation of adjacent maxima to the half-width of the peak. The width 650 of the grid generator peak at half maximum is shown in FIG. 6B. The width 652 of the channel selector peak at half maximum intensity is shown in FIG. 6C. The half width γ is a measure of the sharpness of the peaks, that is, how rapidly the irradiance drops off on either side of a local maximum is given by the half-width.

$$\mathfrak{I} \equiv \frac{2\pi}{\gamma}$$

The positioning of both the grid generator and channel selector within the oscillator, i.e. the ECL cavity, further improves the effective finesse exhibited by the system, due in part to the side mode suppression of the gain medium. To further improve the finesse of the ECL the reflectivity of either or both the grid generator and the channel selector may be increased.

FIGS. 6D–F show graphically the tuning of the channel selector bandpass between a channel centered at 1549.5 nm and an adjacent channel at 1550 nm. The selection of a mode, i.e., channel, generated by the grid generator and the attenuation of adjacent modes/channels is also shown. The lasing mode, i.e., selected channel, is stationary at one particular channel for filter offsets in the range of approximately +/−one half channel spacing. For larger channel offsets, the lasing mode jumps to the next adjacent channel.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A tunable external cavity laser comprising:
   a gain medium configured to emit a beam;
   a grid generator positioned in the beam and having a first free spectral range that defines a plurality of first pass bands centered on gridlines of a wavelength grid; and
   a channel selector positioned in the beam and having a second free spectral range broader than the first free spectral range, the second free spectral range defining at least one second pass band, the channel selector tunable to align the second pass band with a selected one of the first pass bands.

2. The tunable external cavity laser of claim 1, wherein the second free spectral range of said channel selector at least substantially corresponds to the spacing between a longest wavelength channel and a shortest wavelength channel in the wavelength grid.

3. The tunable external cavity laser of claim 1, wherein the second pass band is centered between the shortest wavelength channel and the longest wavelength channel of the wavelength grid.

4. The tunable external cavity laser of claim 1, wherein the gain medium comprises a laser diode.

5. The tunable external cavity laser of claim 1, wherein the grid generator comprises at least one of a Fabry-Perot filter and an interference element.

6. The tunable external cavity laser of claim 1, wherein the grid generator comprises an etalon.

7. The tunable external cavity laser of claim 1, wherein the grid generator comprises:
   an Etalon; and
   a thermal controller to control a temperature of said Etalon to maintain the first selected optical path length.

8. The tunable external cavity laser of claim 1, wherein the channel selector comprises at least one of; a diffraction element, an interference element, and a birefringent element.

9. The tunable external cavity laser of claim 8, wherein the channel selector further comprises:

a mechanical actuator to tune the at least one of a diffraction element, an interference element, and a birefringent element.

10. The tunable external cavity laser of claim 8, wherein the birefringent element includes at least one of: a Pockels cell and a Kerr cell.

11. The tunable external cavity laser of claim 1, wherein the channel selector comprises an interference element having a tunable optical path length to tune the beam.

12. The tunable external cavity laser of claim 11, further comprising at least one of a mechanical tuner and an electro-optical tuner for tuning the tunable optical path length.

13. The tunable external cavity laser of claim 11 wherein the interference element includes a selected optical path length and a tunable index of refraction.

14. The tunable external cavity laser of claim 11, wherein the interference element includes a selected index of refraction.

15. The tunable external cavity laser of claim 11, wherein the interference element comprises:
    an air gap etalon tunable by means of tuning a pressure of a gas within the gap to vary the index of refraction.

16. The tunable external cavity laser of claim 11, wherein the interference element comprises:
    an etalon electrically tunable in response to an applied electric field to vary the optical pathlength.

17. The tunable external cavity laser of claim 16, wherein the etalon further comprises:
    a liquid crystal element with a tunable index of refraction responsive to the applied electric field.

18. The tunable external cavity laser of claim 16, wherein the etalon further comprises:
    a semiconductor element with a tunable index of refraction responsive to the applied electric field.

19. The tunable external cavity laser of claim 11, wherein the interference element comprises:
    a wedge-shaped etalon.

20. The tunable external cavity laser of claim 19, wherein the wedge-shaped etalon further comprises:
    an actuator for translating said wedge-shaped etalon across the optical path of the beam.

21. The tunable external cavity laser of claim 11, wherein the interference element comprises at least one of a wedge-shaped solid etalon and a wedge-shaped air gap etalon.

22. The tunable external cavity laser of claim 1, wherein the channel selector further comprises:
    a diffraction grating with a free spectral range substantially corresponding to the spacing between a longest wavelength channel and a shortest wavelength channel of the wavelength grid.

23. The tunable external cavity laser of claim 1, further comprising:
    a logic element configured to tune the channel selector to a selected one of the plurality of channels of the wavelength grid.

24. A tunable external cavity laser comprising:
    a gain medium configured to emit a beam;
    a first filter positioned in the beam and configured to exhibit first pass bands corresponding to a plurality of channels of a wavelength grid; and
    a second filter positioned in the beam and configured to exhibit at least one second pass band broader than the first pass bands, the second filter tunable to align the second pass band with a selected one of the first pass bands.

25. The tunable external cavity laser of claim 24, wherein the second pass band of the second filter correspond to the spacing between a longest wavelength channel and a shortest wavelength channel in the wavelength grid.

26. The tunable external cavity laser of claim 24, wherein the second pass band is centered between a shortest wavelength channel and a longest wavelength channel of the wavelength grid.

27. A method for tuning a light beam emitted by a gain medium, comprising:
    positioning first filter in the light beam, the first filter generating a first interference to define first pass bands corresponding to channels of a wavelength grid;
    positioning a second filter in the light beam, the second filter generating a second interference to define at least one second pass band broader than the first pass bands;
    feeding back light from the first and second filters to the gain medium; and
    adjusting an order of the second interference to align the second pass band with a selected one of the first pass bands.

28. The method of claim 27, wherein the adjusting the order of the second interference comprises tuning the second filter.

29. The method of claim 27, wherein the adjusting the order of the second interference is carried output between a shortest wavelength channel and a longest wavelength channel of the wavelength grid.

* * * * *